United States Patent
Tan et al.

(10) Patent No.: US 8,318,526 B2
(45) Date of Patent: *Nov. 27, 2012

(54) MANUFACTURING METHOD FOR LIGHT-SENSING STRUCTURE

(75) Inventors: Siew-Seong Tan, Hsinchu (TW);
Yi-Hsiang Chiu, Hsinchu (TW);
Jen-Chieh Chen, Hsinchu (TW)

(73) Assignee: Memsor Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/017,035

(22) Filed: Jan. 30, 2011

(65) Prior Publication Data
US 2012/0034729 A1 Feb. 9, 2012

(30) Foreign Application Priority Data
Aug. 9, 2010 (TW) ................................ 99126494 A

(51) Int. Cl.
*H01L 31/0232* (2006.01)
*H01L 31/18* (2006.01)
(52) U.S. Cl. .............. 438/69; 438/57; 438/64; 438/754; 257/E31.127; 257/E31.001
(58) Field of Classification Search ...................... 438/57, 438/69, 199, 202, 754, 64
See application file for complete search history.

(56) References Cited

U.S. PATENT DOCUMENTS

| | | | |
|---|---|---|---|
| 7,623,278 B2* | 11/2009 | Mestha et al. | 358/504 |
| 2003/0032293 A1* | 2/2003 | Kim et al. | 438/694 |
| 2005/0227428 A1* | 10/2005 | Mihai et al. | 438/222 |
| 2005/0244099 A1* | 11/2005 | Pasch et al. | 385/18 |
| 2007/0117246 A1* | 5/2007 | MacDonald et al. | 438/52 |
| 2008/0080027 A1* | 4/2008 | Mestha et al. | 358/504 |
| 2010/0072490 A1* | 3/2010 | Kerr et al. | 257/88 |
| 2010/0136490 A1* | 6/2010 | Lee et al. | 430/323 |
| 2010/0238454 A1* | 9/2010 | Pruessner et al. | 356/479 |
| 2010/0283069 A1* | 11/2010 | Rogers et al. | 257/98 |
| 2011/0140103 A1* | 6/2011 | Lee et al. | 257/43 |
| 2011/0226937 A1* | 9/2011 | Yu et al. | 250/216 |
| 2011/0250760 A1* | 10/2011 | Tan | 438/712 |

* cited by examiner

*Primary Examiner* — Alexander Ghyka
(74) *Attorney, Agent, or Firm* — CKC & Partners Co., Ltd.

(57) ABSTRACT

A manufacturing method for manufacturing a light-sensing structure is provided. The manufacturing method includes the steps as follows. (a) A circuit layer is formed on an upper surface of a first substrate, wherein the first substrate includes at least one light-sensing device and the circuit layer includes at least one device structure and at least one release feature that is made of metal and is formed on part of the light-sensing device and the device structure. (b) A first light-filtering layer is formed on part of the circuit layer. (c) The release feature is removed by a wet-etching process.

23 Claims, 17 Drawing Sheets

MANUFACTURING METHOD FOR LIGHT-SENSING STRUCTURE

RELATED APPLICATIONS

This application claims priority to Taiwan Application Serial Number 099126494, filed Aug. 9, 2010, which is herein incorporated by reference.

BACKGROUND

1. Technical Field

The present disclosure relates to a manufacturing method for manufacturing an electronic circuit. More particularly, the present disclosure relates to a manufacturing method for manufacturing a light-sensing structure.

2. Description of Related Art

An important trend in the design of electronic circuits is to integrate different kinds of devices on a single chip. For example, the light-sensing device, the active component and the microstructure can be fabricated by performing the light-sensing/active component fabrication process and the microstructure fabrication process separately at first and performing integration later such that these devices can be integrated on the same substrate. The fabrication flow described above is called System-in-package (SIP) process.

Another conventional process is to perform the microstructure fabrication process after the light-sensing/active component fabrication process. After the Microstructure fabrication process, the metallization process of the active component is performed to complete the wafer level system. After the wafer is cut into a plurality of dies, the package process is performed to complete the whole fabrication process. During the fabrication of the microstructure, the RIE is used to form the displaceable component of the microstructure. However, the profile of the microstructure formed by the above process is not ideal. Further, the device for performing the RIE process is expensive. Besides, after the formation of the microstructure and before the package of the die, the particles or other kinds of pollutants may fall into the microstructure such that the microstructure may not be able to operate properly.

Accordingly, what is needed is a method for manufacturing a light-sensing structure that is able to overcome the above issue. The present disclosure addresses such a need.

SUMMARY

An aspect of the present disclosure is to provide a manufacturing method for manufacturing a light-sensing structure is provided. The manufacturing method includes the steps as follows. (a) A circuit layer is formed on an upper surface of a first substrate, wherein the first substrate includes at least one light-sensing device and the circuit layer includes at least one device structure and at least one release feature that is made of metal and is formed on part of the light-sensing device and the device structure. (b) A first light-filtering layer is formed on part of the circuit layer. (c) The release feature is removed by a wet-etching process.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
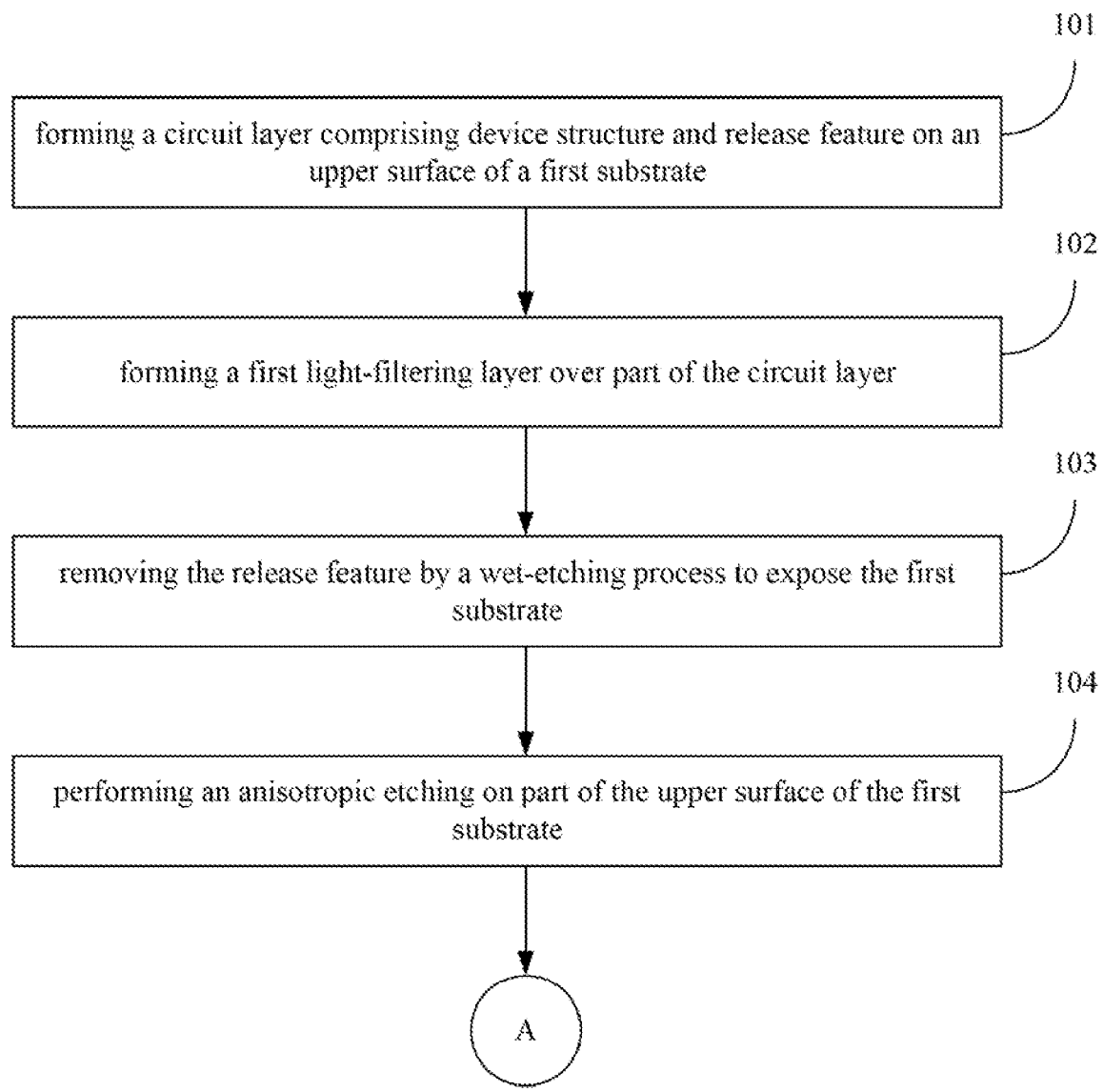
FIG. 1A and FIG. 1B are the flow chart of a manufacturing method for manufacturing a light-sensing structure.

Reference will now be made in detail to the present embodiments of the disclosure, examples of which are illustrated in the accompanying drawings.

Wherever possible, the same reference numbers are used in the drawings and the description to refer to the same or like parts.

Please refer to FIG. 1A and FIG. 2A to FIG. 2J at the same time. FIG. 1A is a flow chart of a manufacturing method for manufacturing a light-sensing structure. FIG. 2A to FIG. 2J are the cross-sectional views of each stage of the manufacturing method in an embodiment. The manufacturing method comprises the steps as follows. (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 101, a circuit layer 200 is formed on an upper surface of a first substrate 210. Please refer to FIG. 2A, the circuit layer 200 is formed on the upper surface 212 of the first substrate 210. In an embodiment, the first substrate 210 is a Si wafer and the first substrate 210 comprises light-sensing device 214a, 214b, 214c and 214d. The circuit layer 200 comprises device structure 202, release feature 204 and dielectric material layer 206. The release feature 204 is made of metal material. Substantially, the metal material may comprises dielectric material as well, and the dielectric material will be removed in a subsequent wet-etching process. The release feature 204 is formed on part of the light-sensing device and the device structure 202.

In the present embodiment, the release feature 204 is formed on the light-sensing device 214a, 214d, and the release feature 204 surrounds the device structure 202 in a neighboring area of the device structure 202 to penetrate the circuit layer 200. The release feature 204 formed on the light-sensing device 214a penetrates the circuit layer 200 to a deeper depth and has a closer distance from the light-sensing device 214a. The release feature 204 formed on the light-sensing device 214d penetrates the circuit layer 200 to a relative shallower depth and has a longer distance from the light-sensing device 214d. In the present embodiment, the circuit layer 200 within the "longer distance" further comprises a shaped metal layer 201.

In an embodiment, the step of forming the circuit layer 200 further comprises forming a CMOS device 208. It may comprise four metallization processes and two polycide processes (2P4M) or may comprise five metallization processes and one polycide process (1P5M) in a conventional standard fabrication process. Therefore, in an embodiment, the release feature 204 can be formed at the same time during the formation of the CMOS device 208 by designing a proper mask. However, the above description is merely one example relating to the CMOS device, and the scope of the present disclosure is not limited thereto. The method of the present disclosure can be further adapted to the devices such as BiCMOS or other devices. Furthermore, the fabrication processes other than 2P4M and 1P5M can be used in the present disclosure as well. For example, when a through hole of the CMOS device is formed, the dielectric layer in the specific position that the release feature 204 is supposed to be formed is removed. When the metal layer of the CMOS device 208 is formed, the metal material can be filled into the specific position. Accordingly, the release feature 204 can be formed during the formation of the CMOS device 208. In another embodiment, the metal used to form the metal layer of the CMOS device 208 is aluminum and the metal filled in the through hole of the CMOS device 208 is tungsten. Consequently, the release feature 204 can be formed by both tungsten and aluminum. In yet another embodiment, the circuit layer 200 comprises a pad 203 that is made of metal and is electrically connected to the CMOS device 208.

In an embodiment, the device structure 202 is formed during the formation of the CMOS device 208. In the present embodiment, the device structure 202 is disposed on the light-sensing device 214c. In other embodiments, the device structure 202 doesn't need to be formed on the light-sensing device. The device structure 202 can be formed independently in the circuit layer 200. Part of the device structure 202 can be formed during the formation of the CMOS device 208. Other elements such as the metal line for electrical connection in the microstructure can be formed during the formation of the CMOS device 208 as well. Therefore, part of the device structure 202 includes the same metal layer as in the CMOS device 208 (such as aluminum and/or tungsten). Further, the metal layer of part of the structure can be electrically connected to each other and then be electrically connected to the circuit layer 200.

Figure 2A:
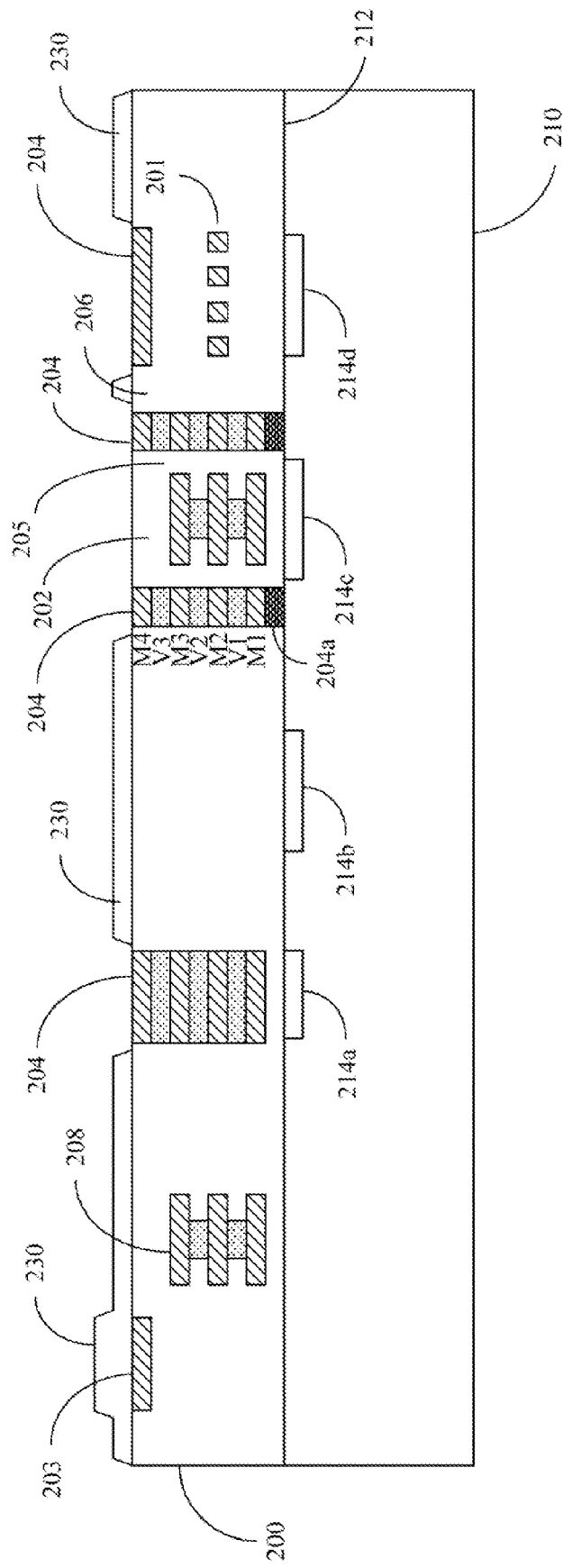
FIG. 2A to FIG. 2J are the cross-sectional views of each stage of the manufacturing method in an embodiment.

In the present embodiment, as shown in FIG. 2A, the circuit layer 200 comprises four metal layers M1, M2, M3 and M4, the contact and three vias V1, V2 and V3. The shaped metal layer 201, the device structure 202, the pad 203, the release feature 204 and the CMOS device 208 each has parts of the structure corresponding to the metal layers M1-M4 and the vias V1-V3. For example, the CMOS device 208 is corresponding to the metal layers M1-M3 and the vias V1-V2. The release feature 204 surrounding the device structure 202 has the contact 204a connected to the first substrate 210.

In another embodiment, as shown in FIG. 2A, the device structure 202 comprises the same dielectric material 205 as the CMOS device (such as silicon oxide and/or silicon nitride), and the dielectric material 205 is located at the outer surface of the device structure 202. The thickness of the dielectric material 205 can be within the range of about 0.1 um to 3 um. For example, the thickness of the dielectric material 205 can be 1 um, 2 um or 3 um.

In an embodiment, the step of forming the circuit layer 200 further comprises forming the passivation layer 230 on the circuit layer 200 at the same time. As shown in FIG. 2A, the passivation layer 230 is formed on the circuit layer 200. In an embodiment, the passivation layer 230 covers the pad 203. However, the release feature 204 is not coated by the passivation layer 230. In other words, the release feature 204 is exposed for the subsequent process.

In an embodiment, the passivation layer 230 can be silicon oxide layer, silicon nitride layer or a multi-layer structure comprising silicon oxide and silicon nitride. The passivation layer 230 can be formed by conventional chemical vapor deposition process or other fabrication process.

Figure 2B:
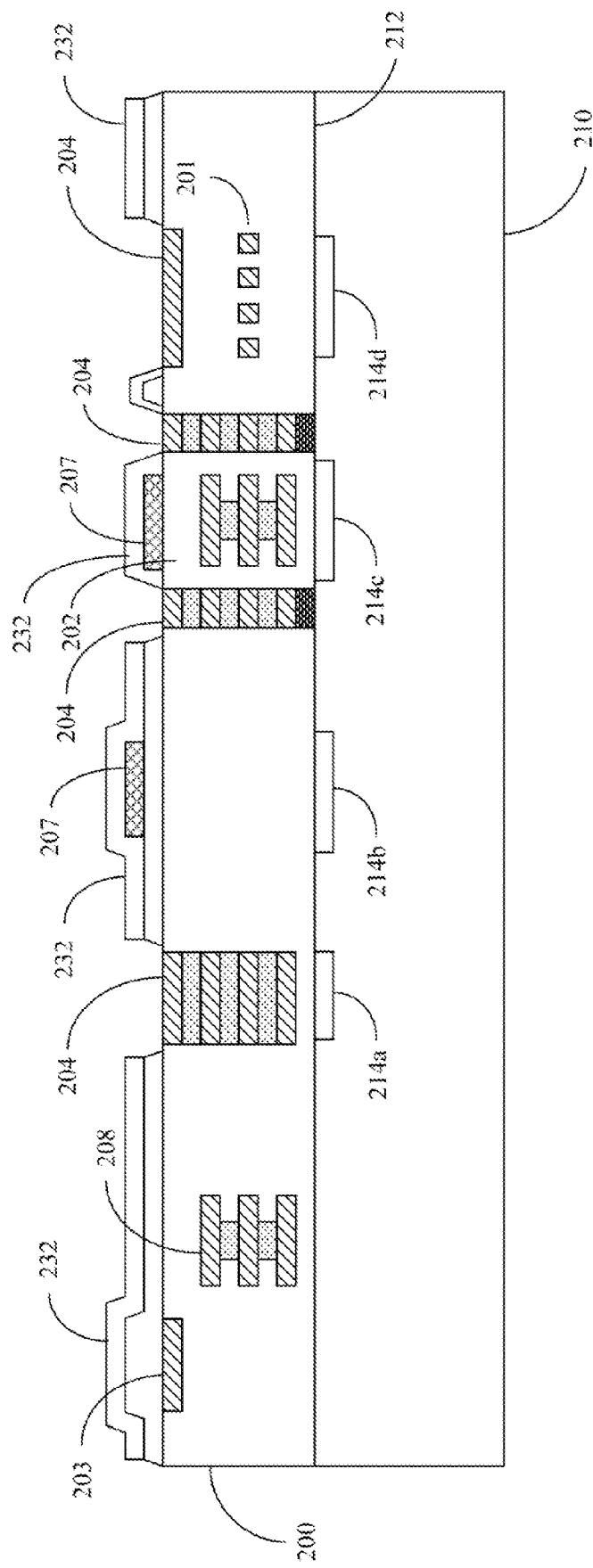

In step 102, a first light-filtering layer 207 is formed over part of the circuit layer 200. As shown in FIG. 2B, in the present embodiment, the first light-filtering layer 207 is formed over the passivation layer 230 corresponding to the part of the circuit layer 200 that has light-sensing device 214b and is formed over the part of the circuit layer 200 corresponding to the device structure 202 (comprising the light-sensing device 214c). The first light-filtering layer 207 provides a light-filtering mechanism such that only the light with a specific range of wavelength is able to pass the first light-filtering layer 207. The light-sensing device 214b, the device structure 202 and the light-sensing device 214c under the first light-filtering layer 207 are able to make use of the filtered light. It's noticed that, the first light-filtering layer 207 having different light-filtering characteristics can be formed in different areas according to the type of the devices disposed in the area. For instance, the part of the first light-filtering layer 207 formed on the light-sensing device 214b allows the green light passing through the first light-filtering layer 207 only and the part of the first light-filtering layer 207 formed on the device structure 202 allows the red light passing through the first light-filtering layer 207 only.

In an embodiment, an anti-etching layer 232 is formed during the formation of the first light-filtering layer 207. The anti-etching layer 232 provides the top of the circuit layer 200 the protection and the anti-etching ability in addition to the passivation layer 230. Further, the anti-etching layer 232 provides the first in light-filtering layer 207 a protection mechanism when the first light-filtering layer 207 is made of a material that does not have the anti-etching ability. The anti-etching layer 232 can be made of the same material as the passivation layer 230 (oxide, for example). In another embodiment, when the first light-filtering layer 207 is made of a material having the anti-etching ability, the anti-etching layer 232 needs not to be formed thereon.

Figure 2C:
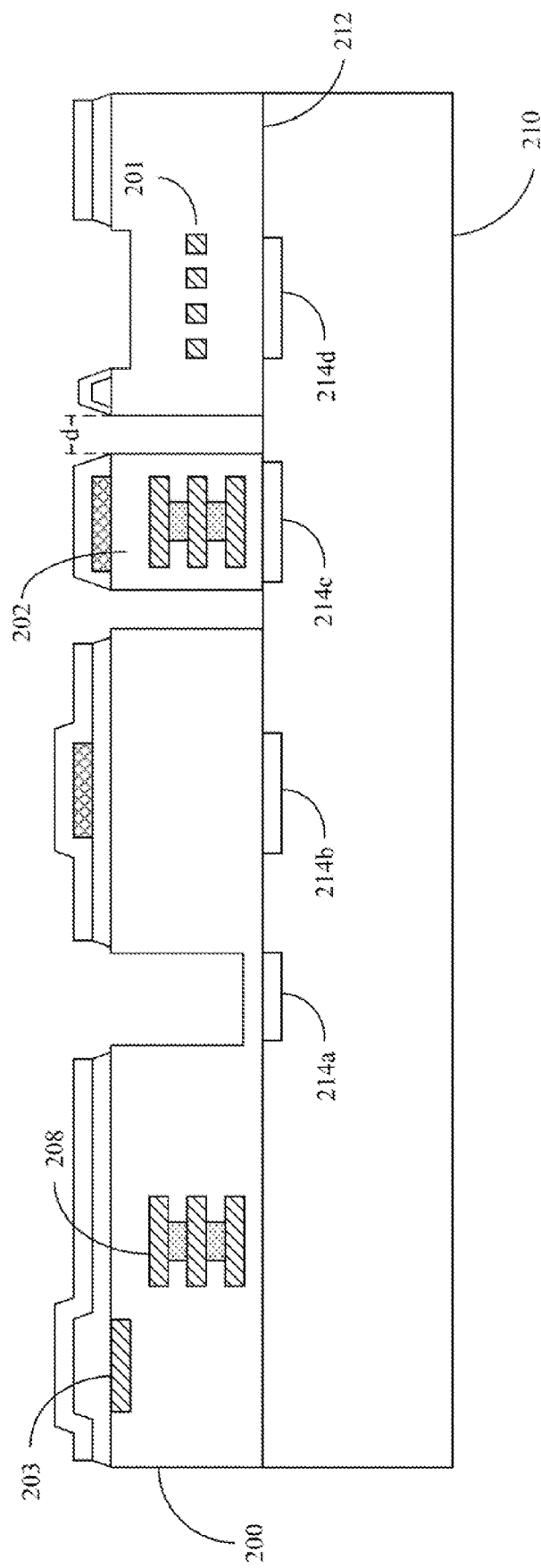

In step 103, the release feature 204 is removed by a wet-etching process to expose the first substrate 210. As shown in FIG. 2C, the release feature 204 depicted in FIG. 2B is removed by the wet-etching process. In the present embodiment, the release feature 204 above the light-sensing device 214a and the light-sensing device 214d is formed on the light-sensing device 214a and the light-sensing device 214d and penetrating the circuit layer 200 to a specific depth respectively. Therefore, after the removal of the release feature 204, the circuit layer 200 corresponding to the specific depth is exposed.

The first substrate 210 is exposed after the release feature 204 surrounding the device structure 202 is removed. After the removal of the release feature 204, a gap d is formed in the device structure 202 itself and other parts between the device structure 202 and the circuit layer 200. In an embodiment, the breadth of the gap d is within the range of about 1 um to 4 um. For example, the breadth of the gap d can be 2 um or 3 um. The etchant used in step 104 has high etch selectivity to the metal and the oxide (or nitride), such as 15:1, or over 20:1 such as 30:1 or higher. Thus, after the removal of the release feature 204, a better profile can be obtained. In an embodiment, the release feature 204 is formed by aluminum and tungsten, the passivation layer 230 is a silicon oxide layer and the wet-etching process makes use of an etchant comprises sulfuric acid and hydrogen peroxide. In a specific embodiment, the ratio of the weight of sulfuric acid and hydrogen peroxide is about 2:1. A satisfying profile can be obtained during the etching of the metal material of the release feature 204.

In the conventional technology, the RIE process is used to remove the dielectric material in the circuit layer 200 (such as silicon oxide or silicon nitride). However, the profile formed by the RIE process is not ideal. Further, the manufacturing device of the RIE process is very expensive. Thus, according to an embodiment of the present disclosure, the release feature 204 is first formed by filling the metal material in the area that is supposed to be removed. Afterward, the release feature 204 is removed by the wet-etching process. A better profile (comparing with the RIE process) is obtained by using an etchant with high etch selectivity. Besides, the release feature 204 can be formed during the formation of the circuit layer 200. No additional process is needed to form the release feature 204. Consequently, a lower cost and a better profile can be obtained in the procedure of the present disclosure.

Figure 2D:
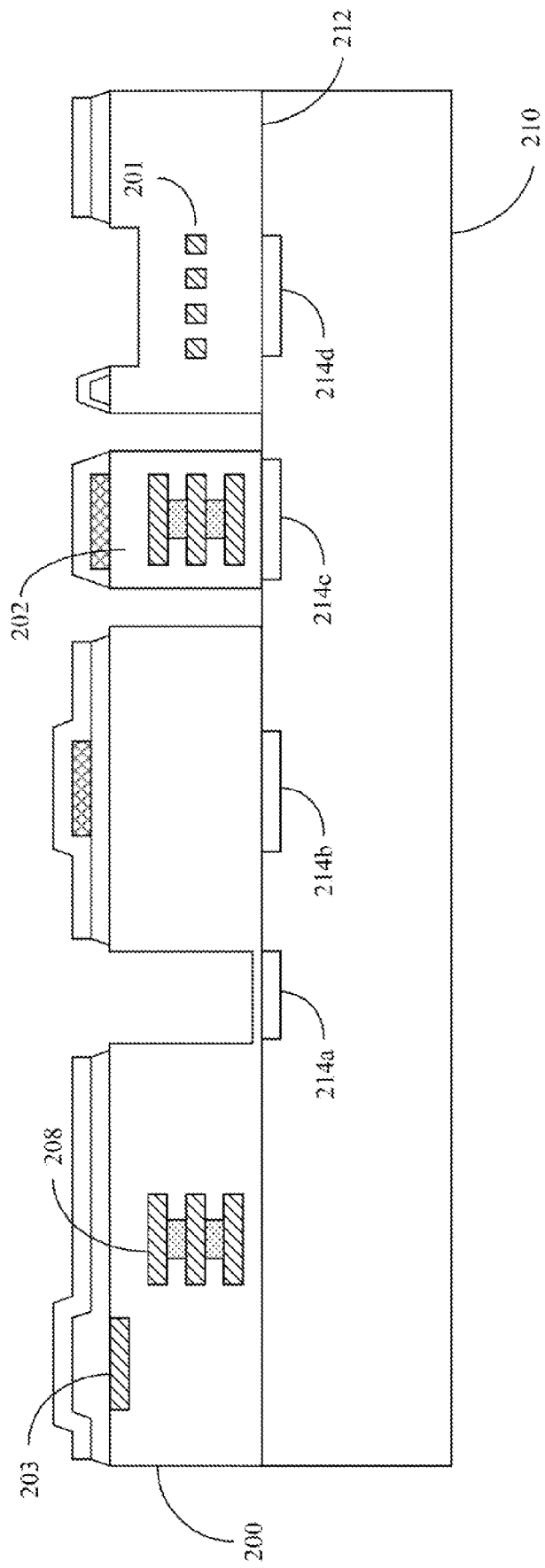
Figure 2E:
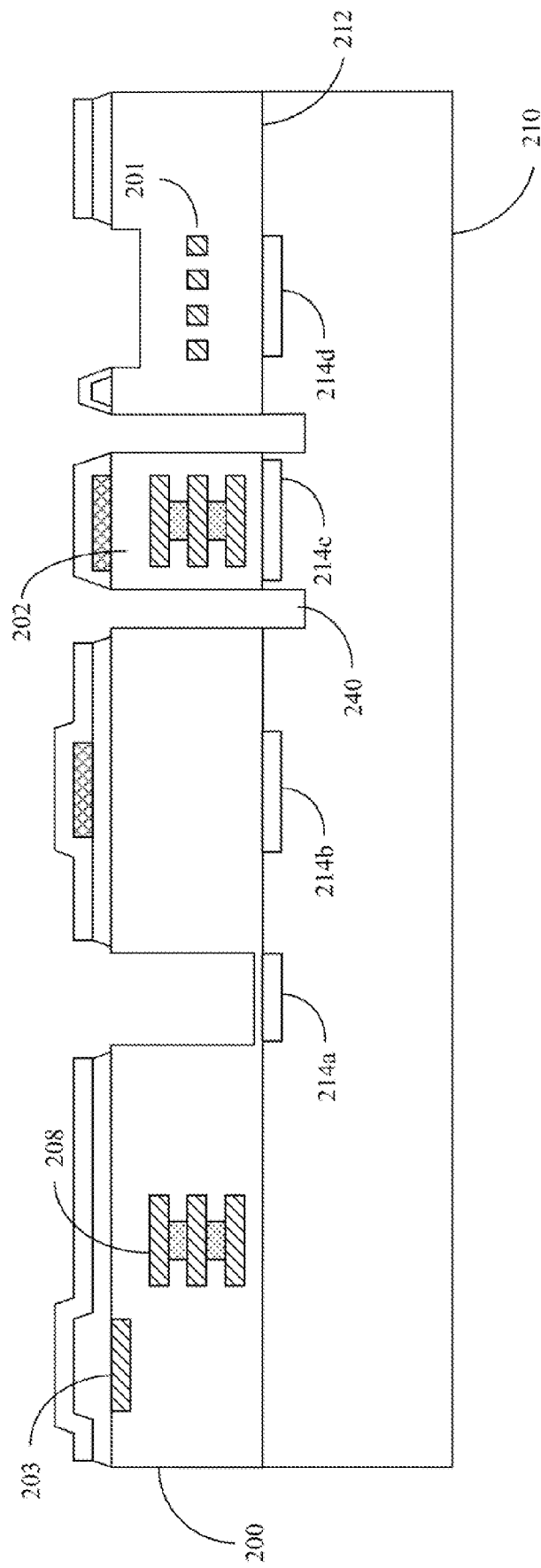

In step 104, part of the exposed first substrate 210 is etched by an anisotropic etching process. As shown in FIG. 2E (the step in FIG. 2D is described later), part of the first substrate 210 exposed in step 103 is etched by the anisotropic etching process. In an embodiment, the anisotropic etching process comprises a DRIE (deep reactive ion etching etching) process. In another embodiment, the anisotropic etching performed on the first substrate 210 further forms a concave part 240 in the first substrate 210, wherein the depth of the concave part 240 is within a range of about 10 um to 60 um. For example, the depth of the concave part 240 can be 20 um, 30 um, 40 um or 50 um. During the anisotropic etching process, the passivation layer 230 (such as silicon oxide or silicon nitride) protects the metal layer underneath (such as the pad 203 and the metal layer in the circuit layer 200) and/or the first light-filtering layer 207 so that the electrical connection metal layer and/or the function of the first light-filtering layer 207 will not be damaged due to the anisotropic etching.

Oxide, such as silicon oxide, may be formed on the upper surface of the first substrate 210 exposed after the removal of the release feature 204 in step 103 (the position of the gap d). Therefore, in an embodiment, a RIE process, which is not an essential process, may be performed before the step 104 to form the structure depicted in FIG. 2D. After the RIE process, the DRIE process described previously is performed to form the structure depicted in FIG. 2E. The oxide on the first substrate 210 in the gap d is removed by the RIE process. Part of the concave part formed during the removal of the release feature 204 will become deeper (comparing with the concave part depicted in FIG. 2C) due to the RIE process.

Figure 1B:
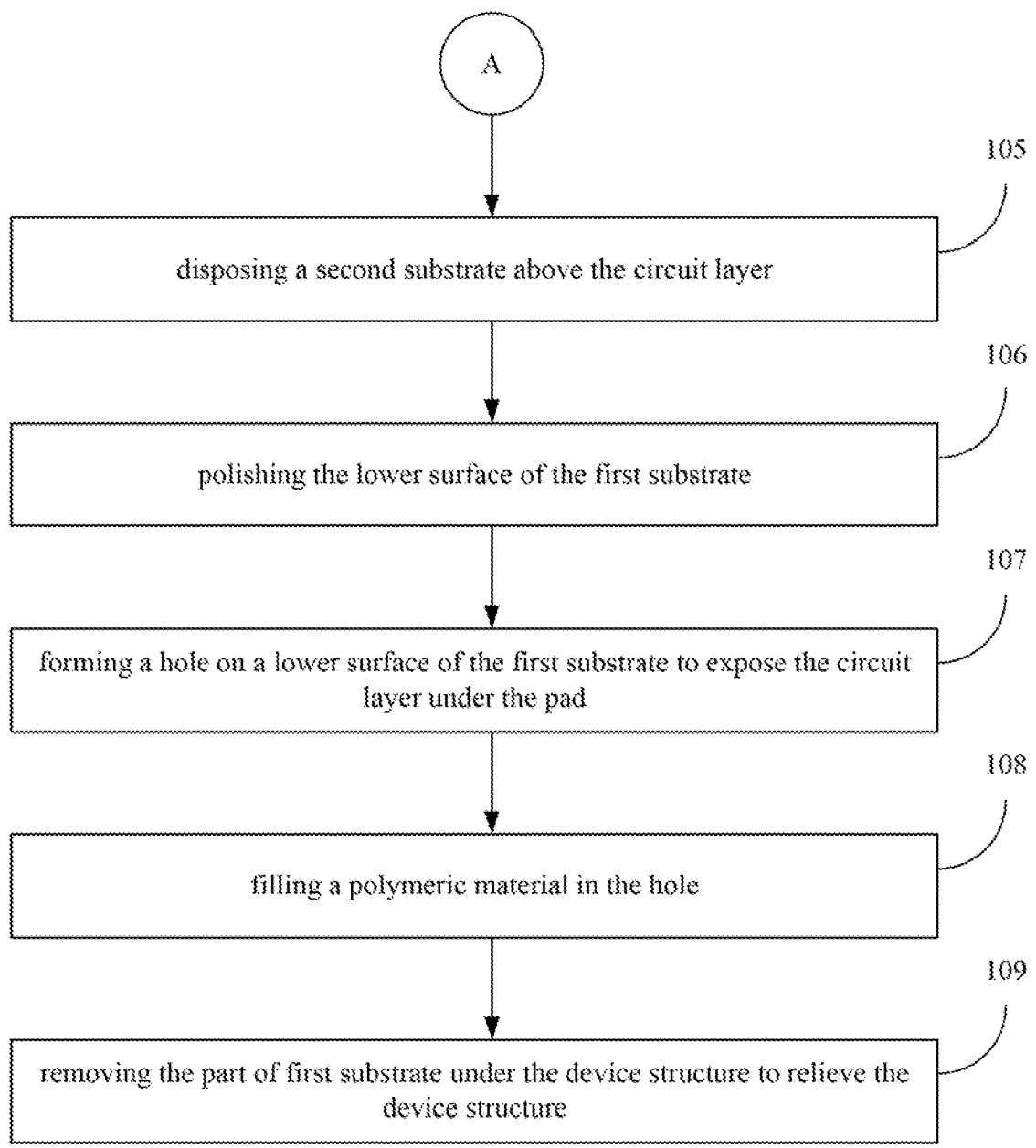

Please refer to FIG. 1B. FIG. 1B is a flow chart depicting the steps after the step 104 shown in FIG. 1A.

Figure 2F:
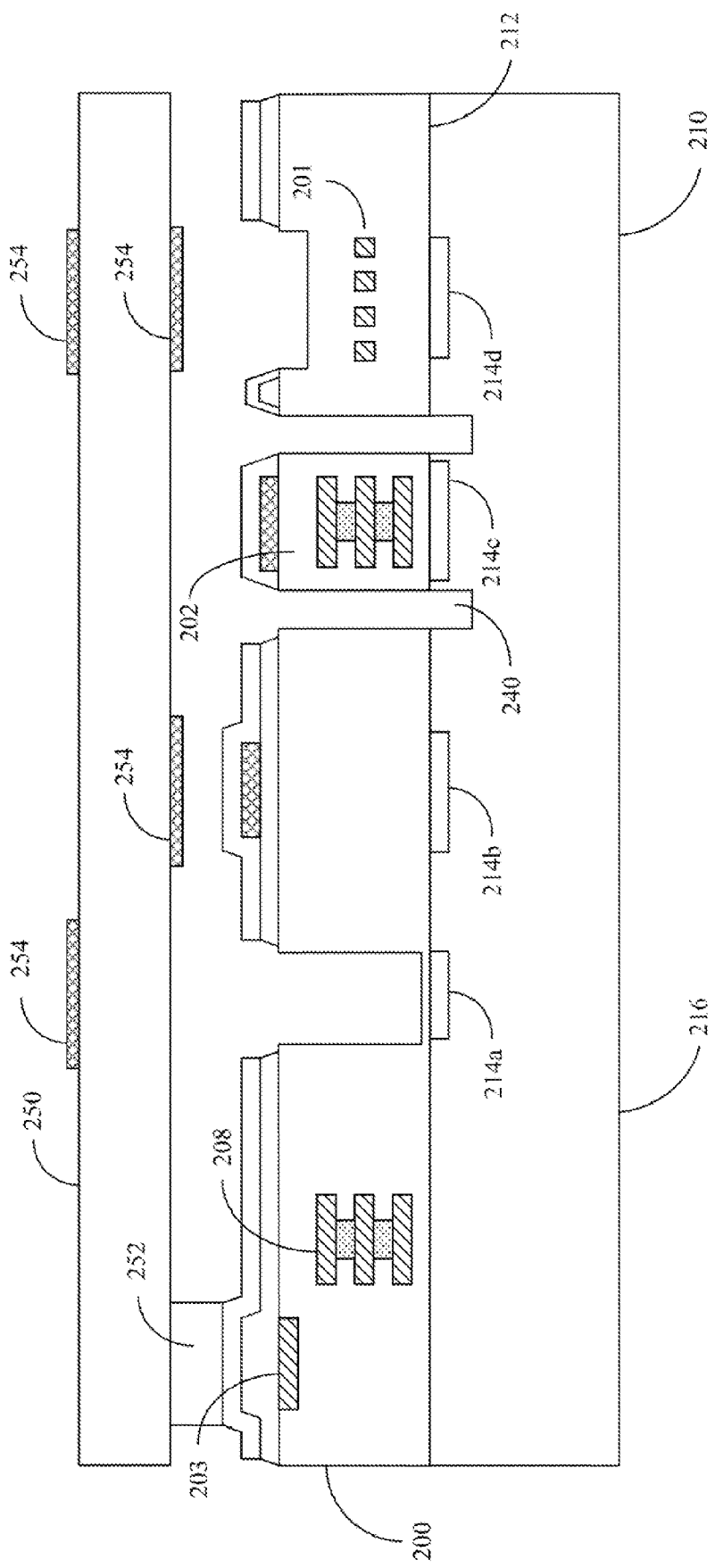

In step 105, a second substrate 250 is disposed above the circuit layer 200. As shown in FIG. 2F, the second substrate 250 is disposed above the circuit layer 200. The second substrate 250 covers the device structure 202 to protect the device structure 202 and prevent the particles from falling into the concave part 240. In an embodiment, the second substrate 250 is a glass substrate or a Si substrate having a thickness within a range from about 50 um to about 500 um. For example, the thickness of the second substrate 250 can be 100 um, 200 um, 300 um or 400 um. In another embodiment, an adhesion layer 252 is disposed between the second substrate 250 and the passivation layer 230 to fix the second substrate 250. Substantially, the adhesion layer 252 surrounds the edges of the second substrate 250 and the circuit layer 200. Therefore, only one side of the adhesion layer 252 is shown in FIG. 2F, which is a partial cross-sectional view.

In another embodiment, the second substrate 250 substantially comprises a second light-filtering layer 254. In the present embodiment, as shown in FIG. 2F, the second light-filtering layer 254 is formed on the positions corresponding to the top of the light-sensing device 214a, 214b and 214d. The second light-filtering layer 254 can be formed on either side of the second substrate 250. The second light-filtering layer 254 can be formed at the same position on both sides of the second substrate 250 as well. Similar to the first light-filtering layer 207, the second light-filtering layer 254 provides a light-filtering mechanism such that only the light with a specific range of wavelength is able to pass the second light-filtering layer 254. The second light-filtering layer 254 can also be formed on the position that is already covered by the first light-filtering layer 207, such as the position where the light-sensing device 214b locates, to reinforce the light-filtering ability or to filter the light with a range of wavelength different from the range of wavelength that the first light-filtering layer 207 performs the filtering mechanism.

Figure 2G:
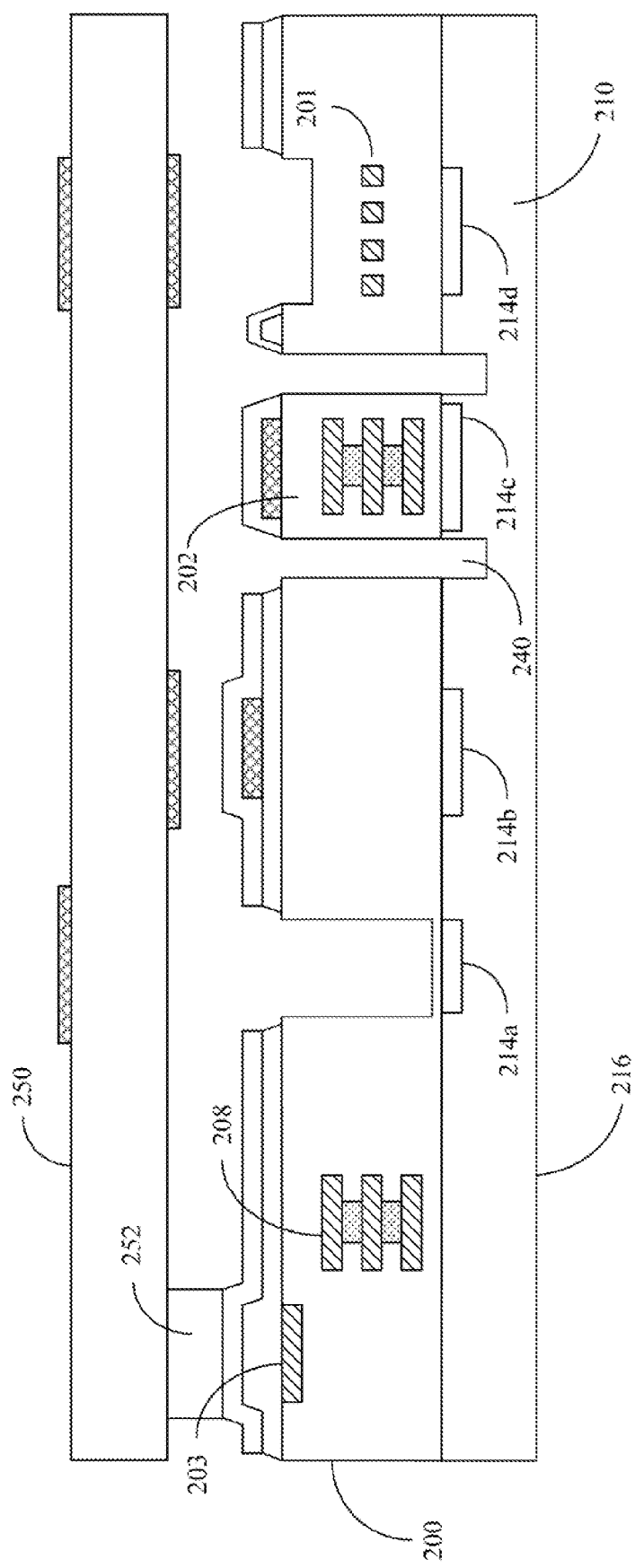

After step 105, an unessential step 106 is performed. In step 106, the lower surface 216 of the first substrate 210 is polished such that the thickness of the first substrate 210 is reduced, as shown in FIG. 2G. For example, the thickness of the first substrate 210 after polishing can be within a range of about 50 um to about 300 um.

Figure 2H:
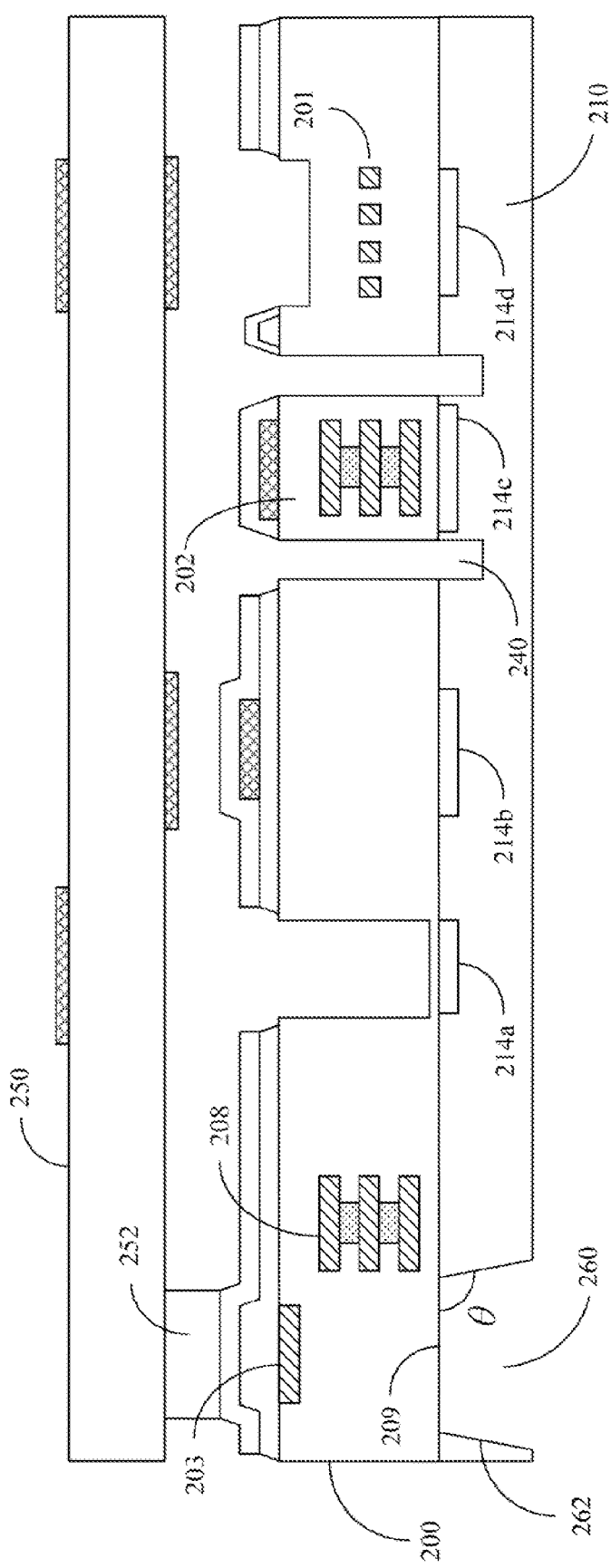

In step 107, a hole 260 is formed on the lower surface of the first substrate 210 to expose the circuit layer 200 under the pad 203, as shown in FIG. 2H. The hole 260 can be formed by performing a dry/wet etching process, by performing a mechanical drilling process or by performing a laser drilling process on the first substrate 210. In an embodiment, the hole 260 has an incline sidewall 262. The angle θ between the sidewall 262 and the lower surface 209 of the circuit layer 200 is larger than 90 degrees. For example, the angle θ can be 100 degrees, 110 degrees, 120 degrees, 140 degrees and 150 degrees.

Figure 2I:
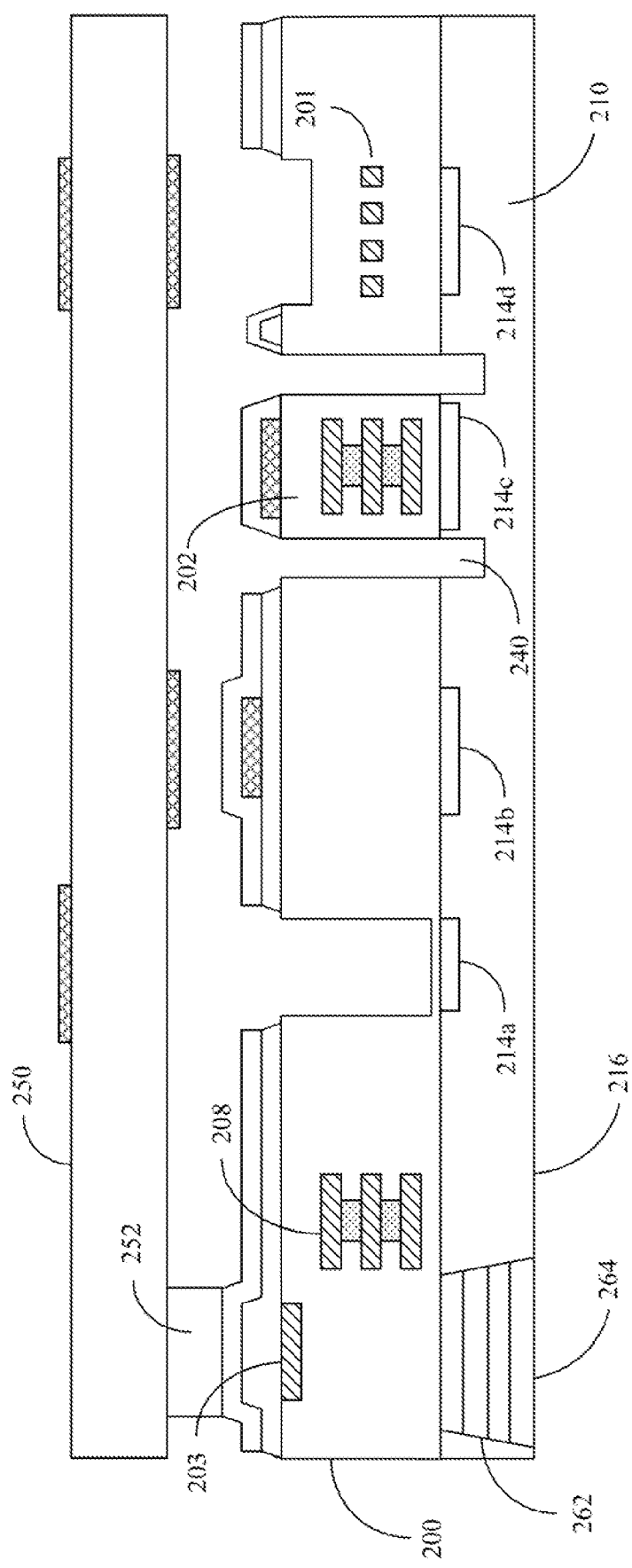

In step 108, a polymeric material is filled in the hole. As shown in FIG. 2I, the polymeric material is filled in the hole 260. In an embodiment, the polymeric material 264 is epoxy. In another embodiment, the surface of the polymeric material 264 filled in the hole 260 is in alignment with the lower surface 216 of the first substrate 210.

Part of the lower surface 216 of the first substrate 210 is removed in step 109 to relieve the device structure 202. In the present embodiment, the device structure 202 can become a MOEMS structure due to the presence of the light-sensing device 214c.

Figure 2J:
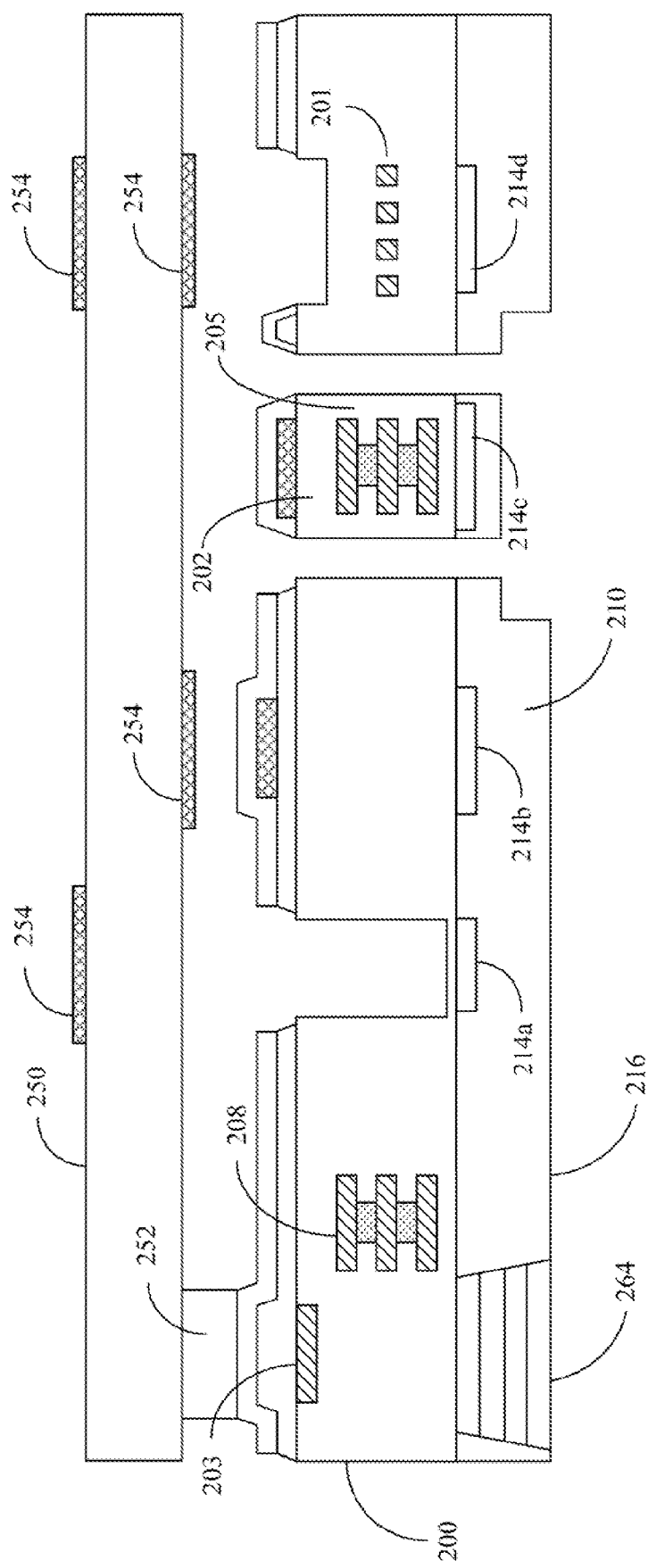

In another embodiment, the light-sensing device 214c needs not to be formed under the device structure 202 such that the device structure 202 is merely a MEMS structure. The term "relieve the device structure 202" means that a displaceable element or component is formed in the MOEMS structure or the MEMS structure. In an embodiment, the microstructure is "relieved" by using the anisotropic etching process to remove part of the lower surface 216 of the first substrate 210, as shown in FIG. 2J. In another embodiment, part of the first substrate 210 under the concave part 240 and the device structure 202 is removed by DRIE process to make the device structure 202 displaceable relative to the first substrate 210 or the second substrate 250. In another embodiment, the device structure 202 can be connected to the other part of the circuit layer 200 through the component such as an elastic supporting means (not shown). Accordingly, when an external force is applied on the device structure 202, a slight displacement can be generated.

Figure 2K:
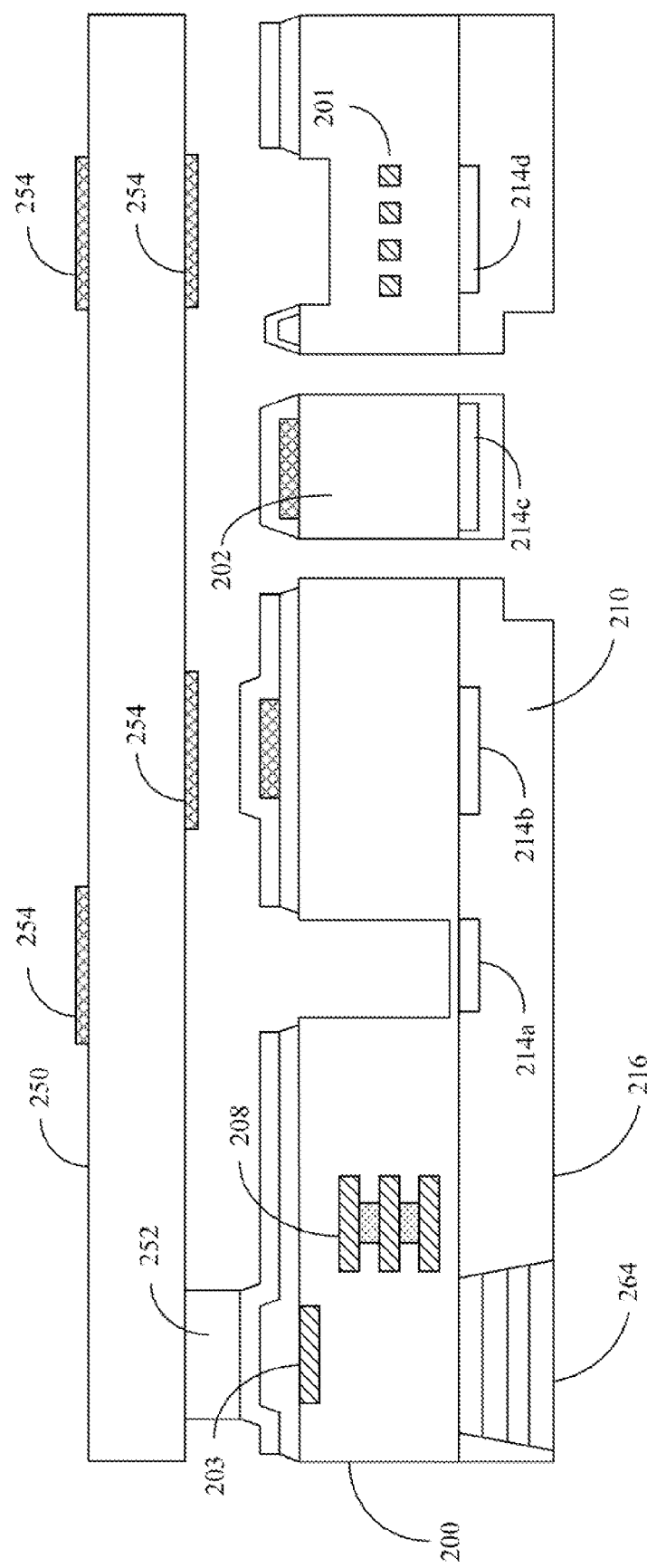
FIG. 2K is a light-sensing structure having a suspension structure in another embodiment.

It's noticed that in an embodiment, the light-sensing device structure 202 that is merely a suspension structure can be formed during the formation of the circuit layer 200, where no metal layer is covered on the top of the light-sensing device structure 202, as shown in FIG. 2K.

The manufacturing process described above can fabricate different devices in the light-sensing structure in a single process flow. Further, a better profile of the devices of the light-sensing structure can be obtained due to the presence of the release feature. Furthermore, the presence of the second substrate comprising the second light-filtering layer can prevent the devices from being polluted by the particles and reinforce the light-filtering mechanism besides the use of the first light-filtering layer.

Figure 3:
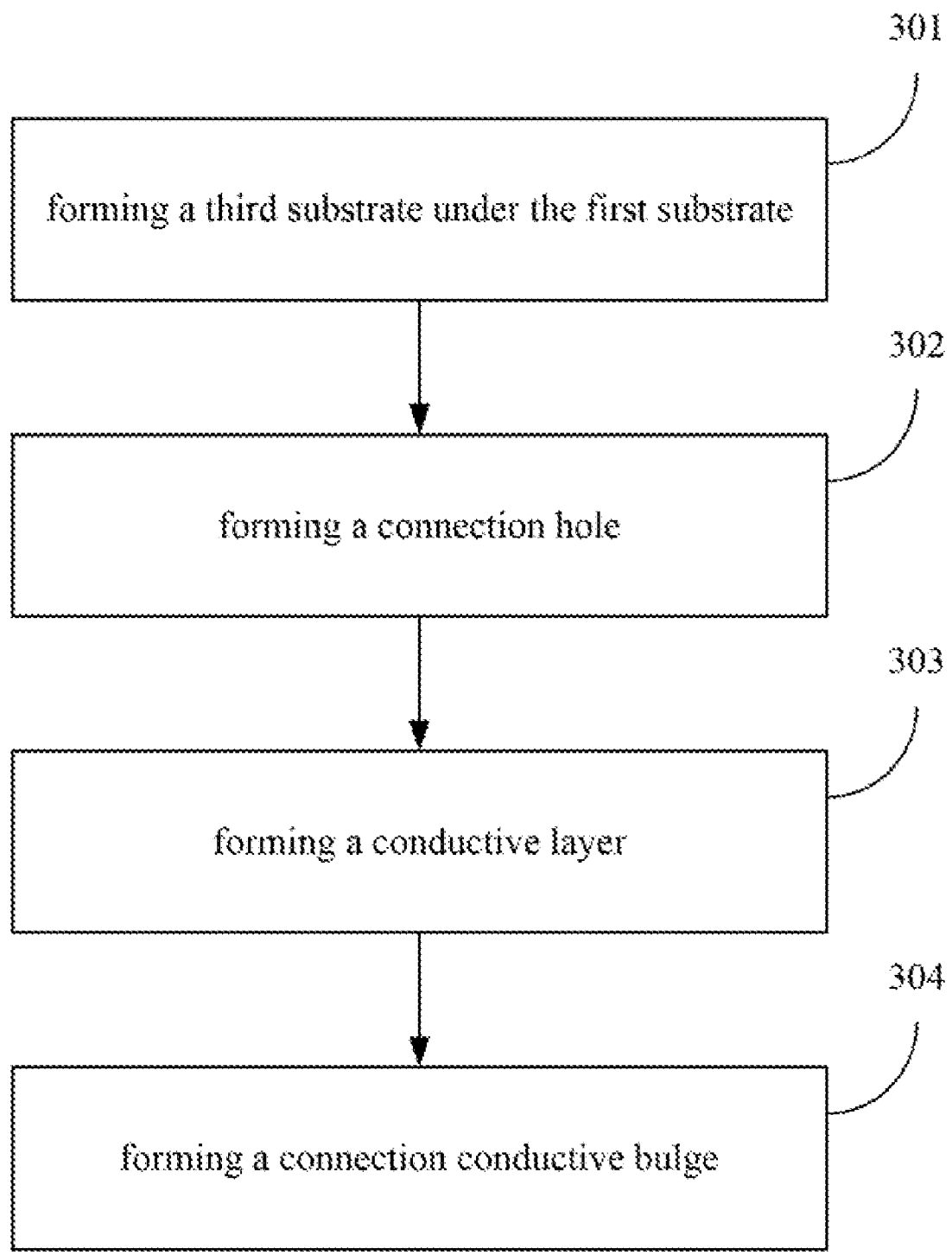
FIG. 3 is a flow chart of the steps after the step 101 to step 109 are finished.
Figure 4A:
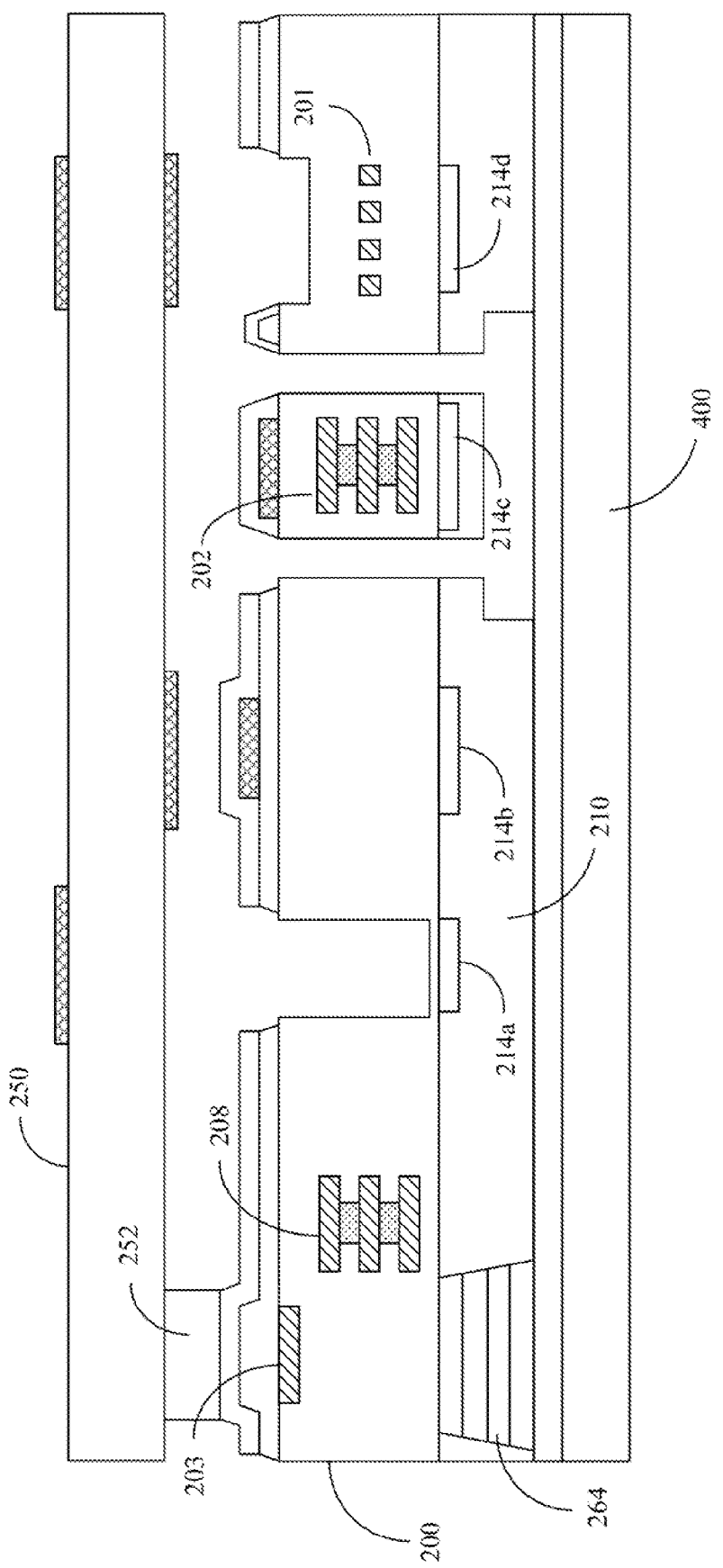
FIG. 4A to FIG. 4C are the cross-sectional views of each stage of the manufacturing method.
Figure 4B:
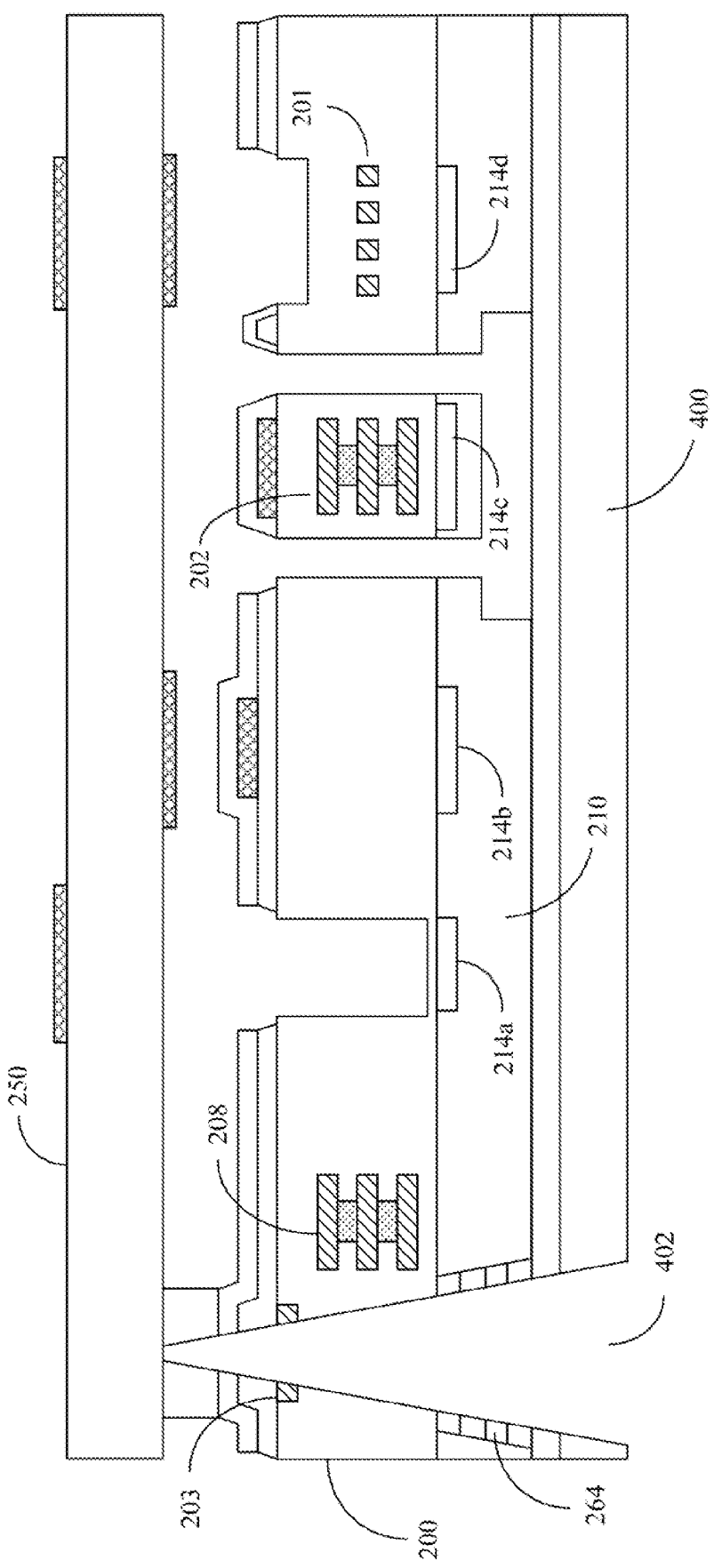
Figure 4C:
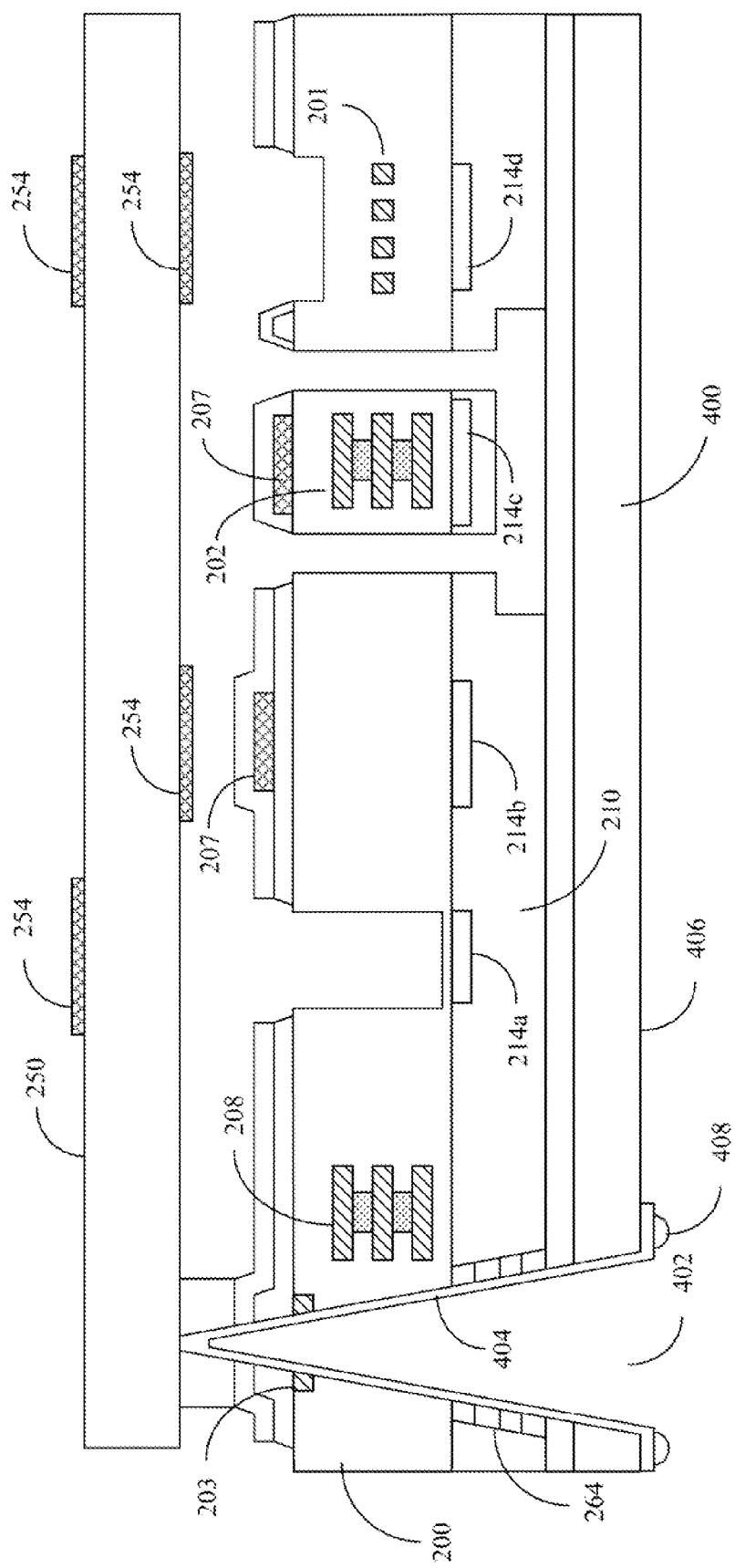

In another embodiment, when the step 101 to step 109 are finished, the step 301 to step 304 are performed subsequently. Please refer to FIG. 3 and FIG. 4A to FIG. 4C. FIG. 3 is a flow chart of the steps after the step 101 to step 109 are finished. FIG. 4A to FIG. 4C are the cross-sectional views of each stage of the manufacturing method from step 301 to step 304 in an embodiment.

In step 301, a third substrate 400 is formed under the first substrate 210, as shown in FIG. 4A. In an embodiment, the third substrate 400 and the second substrate 250 are made of the same material, such as Si or glass. The second substrate 250 and the third substrate 400 form a close space that encloses the device structure 202. Consequently, the second substrate 250 and the third substrate 400 prevents the device structure 202 from being damaged and makes sure that there is no falling particle in the device structure 202 such that the device structure 202 is able to operate normally.

As shown in FIG. 4B, a connection hole 402 is formed on a side of the third substrate 400 in step 302. The connection hole 402 locates at about the position of where the polymeric material 264 is filled. The connection hole 402 further penetrates through the third substrate 400, the polymeric material 264 and the circuit layer 200 to expose the pad 203. The connection hole 402 can be formed by using a mechanical drilling process or a laser drilling process. In an embodiment, the pad 203 is electrically connected to the CMOS device 208. In another embodiment, the pad 203 is electrically connected to the device structure 202.

In step 303, conductive layer 404 is formed in the connection hole 402, as shown in FIG. 4C. The conductive layer 404 is connected to the pad 203 to input or output electronic signals to the system in the circuit layer 200. The conductive layer 404 can be formed by a conventional sputtering process. The conductive layer 404 can be made of copper, aluminum, silver or tungsten. In an embodiment, the conductive layer 404 stretches from the connection hole 402 to the lower surface 406 of the third substrate 400.

A connection conductive bulge 408 is further formed on the conductive layer 404 in step 304. Please refer to FIG. 4C again. In an embodiment, the connection conductive bulge 408 is formed on the conductive layer 404 above the third substrate 400. Thus, the electronic signal can be sent into or out of the device structure 202. In an embodiment, the electronic signal can be sent into or out of the other devices, such as the CMOS device 208 and/or the BiCMOS devices, in the circuit layer 200 through the connection conductive bulge 408. The connection conductive bulge 408 can be formed by any conventional process, such as a screen printing process or a solder ball bumping process. The device structure 202 can be connected to an external circuit (not shown) through the connection conductive bulge 408. After the step 304 is finished, the wafer-level package of the MEMS structure is complete.

In the present embodiment, the manufacturing method for manufacturing the light-sensing structure further forms a third substrate to prevent the devices from being polluted by the particles and provide a electrical connection path after finishing the wafer-level package of the MEMS structure in a single manufacturing process.

It will be apparent to those skilled in the art that various modifications and variations can be made to the structure of the present disclosure without to departing from the scope or spirit of the disclosure. In view of the foregoing, it is intended that the present disclosure cover modifications and variations of this disclosure provided they fall within the scope of the following claims.

What is claimed is:

1. A manufacturing method for manufacturing a light-sensing structure, the manufacturing method comprises the steps of:
    (a) forming a circuit layer on an upper surface of a first substrate, wherein the first substrate comprises at least one light-sensing device and the circuit layer comprises at least one device structure and at least one release feature that is made of metal and is formed on part of the light-sensing device and the device structure;
    (b) forming a first light-filtering layer over part of the circuit layer;
    (c) removing the release feature by a wet-etching process.

2. The manufacturing method of claim 1, wherein the step of forming the circuit layer comprises forming a CMOS device and/or a BiCMOS device.

3. The manufacturing method of claim 2, wherein the step of forming the CMOS device and/or the BiCMOS device further comprises forming the release feature at the same time.

4. The manufacturing method of claim 1, wherein the step (a) further comprises forming a passivation layer on the circuit layer without covering the release feature.

5. The manufacturing method of claim 2, wherein the step (c) further comprises forming an anti-etching layer on the first light-filtering layer and the passivation layer.

6. The manufacturing method of claim 1, wherein the step (c) further comprises disposing a second substrate above the circuit layer and the first light-filtering layer.

7. The manufacturing method of claim 6, wherein the second substrate is icy a glass substrate or a Si substrate and the second substrate has a thick within within a range from about 50 um to about 500 um.

8. The manufacturing method of claim 6, wherein the second substrate comprises a second light-filtering layer located above part of the circuit layer and the first light-filtering layer.

9. The manufacturing method of claim 1, wherein the release feature is formed on the device structure and is formed to surround a neighboring area of the device structure to penetrate the circuit layer, wherein after the step of removing the release feature by the wet-etching process further comprises exposing the upper surface of the first substrate.

10. The manufacturing method of claim 9, wherein after exposing the upper surface of the first substrate further comprises performing an anisotropic etching on part of the upper surface of the first substrate.

11. The manufacturing method of claim 10, wherein the circuit layer further comprises a pad, the device structure is a MEMS (Micro Electro-Mechanical System) structure, after the step (c) further comprises the steps of:
    (d) forming a hole on a lower surface of the first substrate to expose the circuit layer under the pad;
    (e) filling a polymeric material in the hole; and
    (f) removing the part of first substrate under the MEMS structure to relieve the MEMS structure.

12. The manufacturing method of claim 11, wherein before the step (d) further comprises a step of polishing the lower surface of the first substrate to reduce the thickness of the first substrate.

13. The manufacturing method of claim 1, wherein release feature is formed on the device structure or on the light-sensing device to penetrate the circuit layer to a specific depth, wherein after the step of removing the release feature by the wet-etching process further comprises exposing the part of the circuit layer corresponding to the specific depth.

14. The manufacturing method of claim 11, wherein the device structure is substantially a MOEMS (Micro-opto-electro-mechanical system) structure.

15. The manufacturing method of claim 4, wherein the step of forming the passivation layer further comprises forming a oxide layer.

16. The manufacturing method of claim 1, wherein the wet-etching process is performed by an etchant comprising sulfuric acid and hydrogen peroxide.

17. The manufacturing method of claim 10, wherein the anisotropic etching comprises a deep RIE (Reactive Ion Etching) process.

18. The manufacturing method of claim 10, wherein the step of performing the anisotropic etching on part of the upper surface of the first substrate comprises forming a concave part on the first substrate having a depth within a range from about 5 um to about 60 um.

19. The manufacturing method of claim 10, wherein the anisotropic etching comprises a RIE process and a deep RIE process.

20. The manufacturing method of claim 10, wherein the anisotropic etching comprises a RIE process.

21. The manufacturing method of claim 11, wherein after the step (f) further comprises the steps of:
(g) forming a third substrate under the first substrate;
(h) forming a connection hole penetrating through the third substrate, the polymeric material and the circuit layer to expose the pad through the connection hole;
(i) forming a conductive layer on a sidewall of the connection hole to be connected to the pad; and
(j) forming a connection conductive bulge on the conductive layer.

22. The manufacturing method of claim 21, wherein the pad is electrically connected to the device structure to such that the device structure is connected to an external circuit through the pad, the conductive layer and the connection conductive bulge.

23. The manufacturing method of claim 21, wherein the step of forming the circuit layer further comprises forming a CMOS device and/or a BiCMOS device, wherein the pad is electrically connected to the CMOS device and/or the BiCMOS device such that the CMOS device and/or the BiCMOS device is connected to an external circuit through the pad, the conductive layer and the connection conductive bulge.

* * * * *